United States Patent
Tsukada et al.

(10) Patent No.: US 6,667,559 B2
(45) Date of Patent: Dec. 23, 2003

(54) BALL GRID ARRAY MODULE AND METHOD OF MANUFACTURING SAME

(75) Inventors: Yutaka Tsukada, Shiga-ken (JP); Kimihiro Yamanaka, Shiga-ken (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/162,830

(22) Filed: Jun. 4, 2002

(65) Prior Publication Data

US 2002/0187585 A1 Dec. 12, 2002

(30) Foreign Application Priority Data

Jun. 12, 2001 (JP) ........................................ 2001-176650

(51) Int. Cl.[7] ............................................... H01L 23/48
(52) U.S. Cl. ...................... 257/780; 438/612; 438/613; 438/123; 257/738; 257/779
(58) Field of Search ................................. 438/123, 612, 438/613, 614, 125, 106, 108, 111; 257/779, 780, 783, 737, 738, 781

(56) References Cited

U.S. PATENT DOCUMENTS 6,549,413 B2 * 4/2003 Karnezos et al. ............ 361/704

FOREIGN PATENT DOCUMENTS

| JP | 07058329 A | * | 3/1995 | ............ H01L/29/78 |
| JP | 11233669 A | * | 8/1999 | ............ H01L/23/12 |

* cited by examiner

*Primary Examiner*—Caridad Everhart
(74) *Attorney, Agent, or Firm*—William N. Hogg

(57) ABSTRACT

A ball grid array module is provided. In particular, the ball grid array module includes a substrate with two layers of insulation positioned thereon. At least one cavity having a side wall and a bottom wall is positioned in the first and second layers of insulation. The ball grid array module is adapted for having a solder ball positioned on the bottom wall of the cavity. During heating and reflow of the solder ball, positioning of the solder ball in the cavity prevents dislodging of the solder ball.

19 Claims, 5 Drawing Sheets

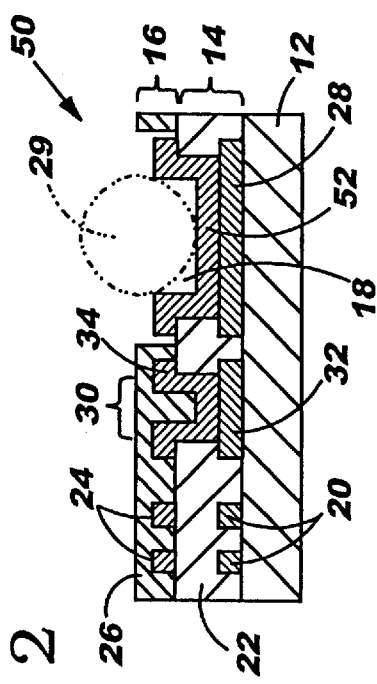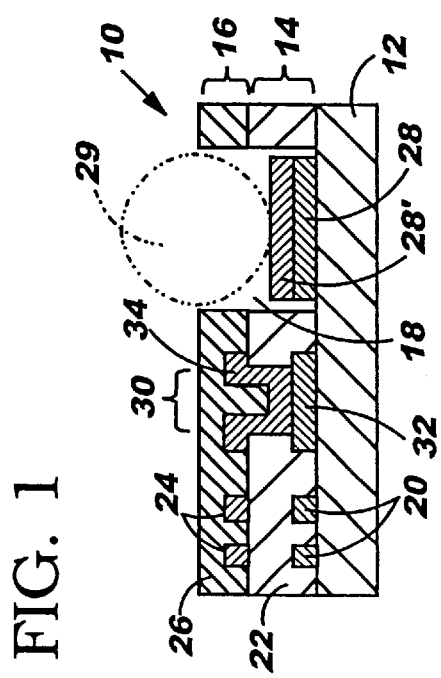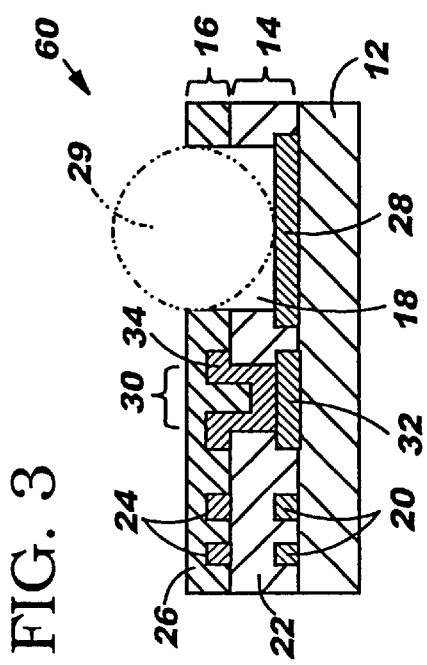

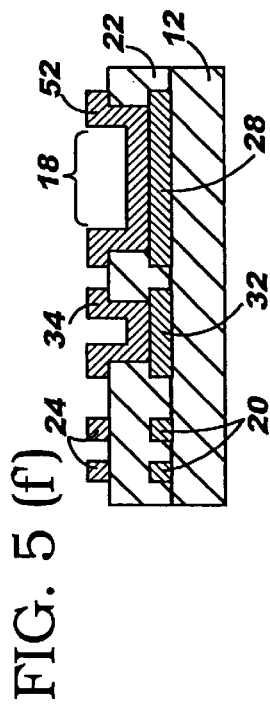
FIG. 5 (f)
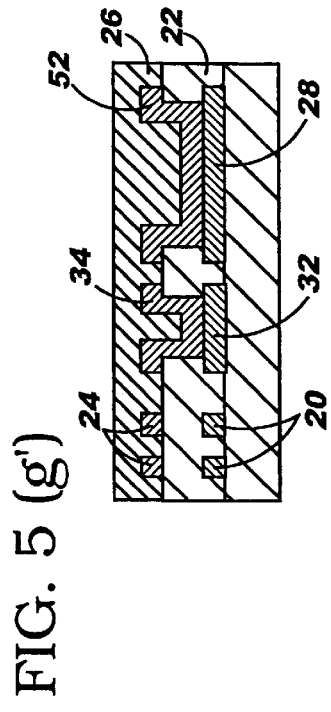
FIG. 5 (g')
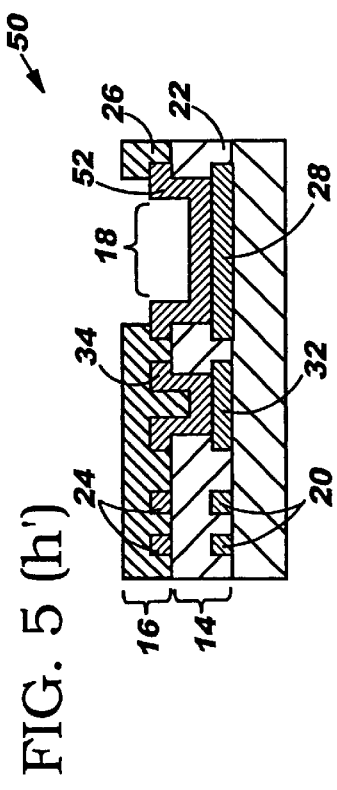
FIG. 5 (h')
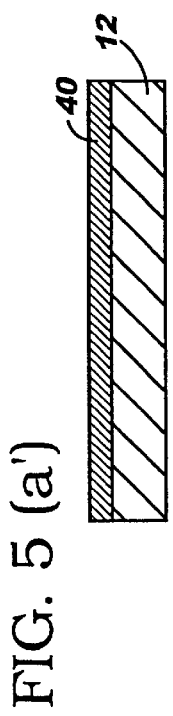
FIG. 5 (a')
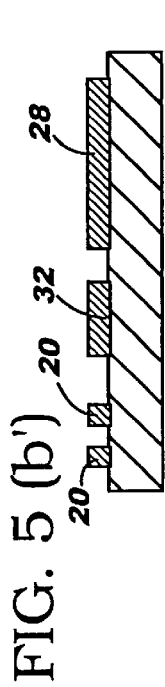
FIG. 5 (b')
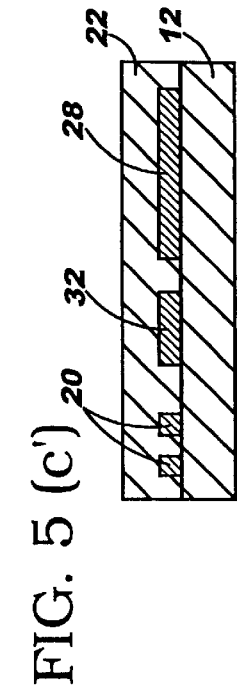
FIG. 5 (c')
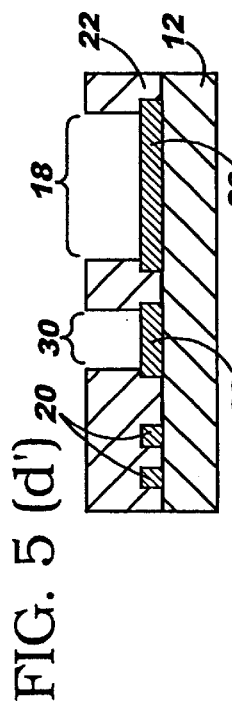
FIG. 5 (d')
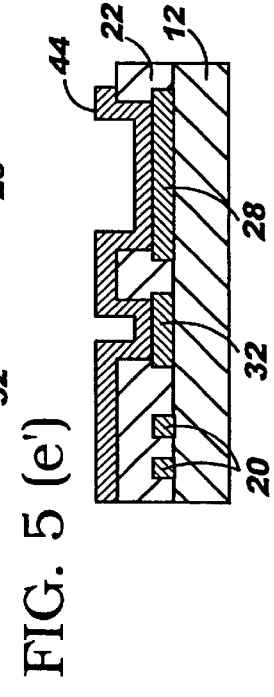
FIG. 5 (e')

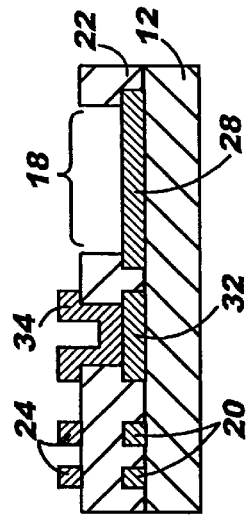
FIG. 6 (e″)
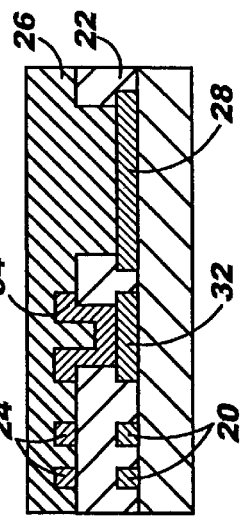
FIG. 6 (f″)
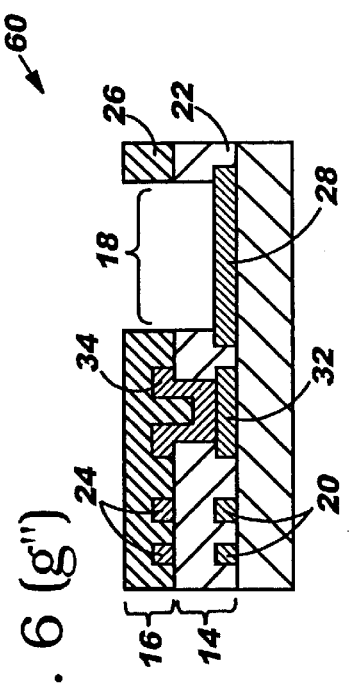
FIG. 6 (g″)
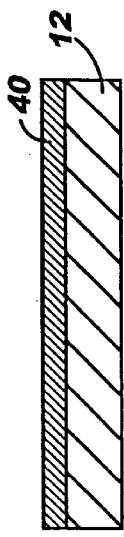
FIG. 6 (a″)
FIG. 6 (b″)
FIG. 6 (c″)
FIG. 6 (d″)
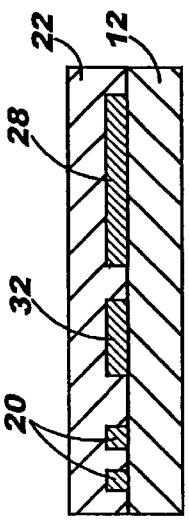
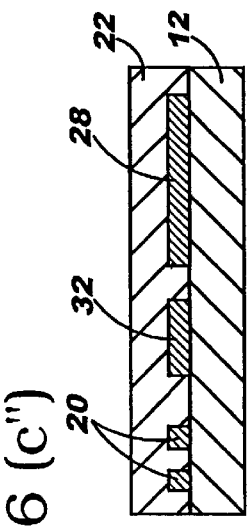

BALL GRID ARRAY MODULE AND METHOD OF MANUFACTURING SAME

TECHNICAL FIELD

The present invention relates to a ball grid array (hereinafter referred to as BGA) module using a built-up circuit board and a method of manufacturing the module. More particularly, it relates to a BGA module having a solder ball structure positioned thereon to make electrical and mechanical connections with a circuit card.

BACKGROUND

As recent high density and high integration advances in ultra large scale integrated circuits (ULSI) have been made, BGA packages are becoming more mainstream in surface mount technology as the solder ball chip connection (SBCC) of choice, superseding conventional surface mount packaging component connections.

A substrate adapted to package a high density and highly integrated flip chip having a terminal BGA connection has low parasitic capacitance and inductance, yielding superior electrical characteristics. BGA packaging is very desirable when a high density package utilizing a tightly spaced contact array of solder joints is needed.

A BGA module can have an electrical structure positioned on the top and/or the bottom surface of a substrate made of a dielectric material such as a ceramic or a plastic. In a structure such as this, contact pads of at least one semiconductor chip and a plurality of solder balls are aligned with the electrical structures on the top and/or bottom surfaces of the substrate and reflowed to make electrical interconnections. FIG. 9 shows an enlarged cross-sectional view in elevation of a portion of a conventional BGA module 100 with a solder ball 102 mounted on a BGA pad 104 before reflow. Solder resist 106 is provided to separate solder ball 102 from a matrix of other solder balls (not shown) during reflow. The thickness of the solder resist is usually about 10 to 20 μm. When solder ball 102 is mounted on BGA pad 104 before reflow using flux, there is a possibility that the solder ball may become dislodged from the BGA pad in the reflow process. More particularly, the mounted solder ball can become dislodged from the BGA pad above and beyond the height of the solder resist by vibrations of the reflow oven conveyor or by the thermal stress generated when the flux is softened. The loss of only one solder ball, for any of the above reasons, is an imperfection in electrical continuity in the BGA module and is a defect.

A variety of techniques can be utilized to keep solder balls from dislodging from the BGA pads during reflow. For example, holding jigs used for arranging solder balls on BGA pads can be employed to hold the solder balls during reflow. Also high viscosity flux in conjunction with solder paste can be applied onto the BGA pads on which the solder balls are arranged to hold the solder balls before and during the reflow process.

When jigs are used, however, a process for arranging jigs is required. On the other hand, when flux is used, a process for applying and removing flux is required. In addition, when solder paste is used, an applying process is required.

The present invention is directed at overcoming the problems set forth above. It is desirable to have a method of making a BGA module that keeps solder balls from becoming dislodged during the process of manufacturing the BGA module.

SUMMARY OF THE INVENTION

Accordingly it is an object of this invention to enhance the art of packaging technology.

It is another object of this invention to provide a novel method for producing a ball grid array module for mounting a semiconductor chip and a solder ball thereon.

It is another object of this invention to provide a ball grid array module that will be manufactured with increased yields and can be produced at relatively lower costs than many current products.

Still another object of this invention is to provide a ball grid array module having a surface for mounting a semiconductor chip or the like and a solder ball thereon. The module includes a cavity for having the solder ball positioned therein that prevents dislodgment of the solder ball during heating of the module, resulting in much lower defect levels.

According to one aspect of the invention, there is provided ball grid array module having a surface for mounting a semiconductor chip and a solder ball. The ball grid array module includes a substrate having an upper surface, a first insulation layer including a first layer of circuitry therein positioned on the upper surface of the substrate, a second insulation layer including a second layer of circuitry therein positioned on the first insulation layer, and at least one internal side wall defining a cavity in the first and second insulation layers and having a bottom wall defined by the upper surface of the substrate, the bottom wall adapted for having the solder ball positioned thereon.

According to another aspect of the invention, there is provided a method of manufacturing a ball grid array module having a surface for mounting a solder ball. The method comprises the steps of providing a substrate having an upper surface, positioning a first insulation layer including a first layer of circuitry therein on the upper surface of the substrate, positioning a second insulation layer including a second layer of circuitry therein on the first insulation layer, and forming at least one internal side wall defining a cavity in the first and second insulation layers and having a bottom wall defined by the upper surface of the substrate, the bottom wall adapted for having the solder ball positioned thereon.

The above objects, advantages, and features of the present invention will become more readily apparent from the following detailed description of the presently preferred embodiments as illustrated in the accompanying drawings.

BRIEF DESCRIPTION OF THE DRAWINGS

FIG. 1 is an enlarged partial cross-sectional view in elevation of one embodiment of a BGA module according to the present invention.

FIG. 2 is an enlarged partial cross-sectional view in elevation of another embodiment of a BGA module according to the present invention.

FIG. 3 is an enlarged partial cross-sectional view in elevation of a BGA module according to yet another embodiment of the present invention.

FIGS. 5(*a'*) to 5(*h'*) show schematic diagrams of the manufacturing process used to make the BGA module as shown in FIG. 2.

FIGS. 6(*a"*) to 6(*g"*) show schematic diagrams of manufacturing process used to make the BGA module as shown in FIG. 3.

BEST MODE FOR CARRYING OUT THE INVENTION

Figure 4:
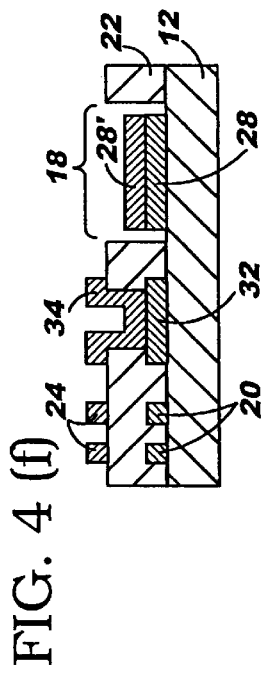
FIGS. 4(*a*) to 4(*h*) show schematic diagrams of the manufacturing process used to make the BGA module as shown in FIG. 1.
Figure 4:
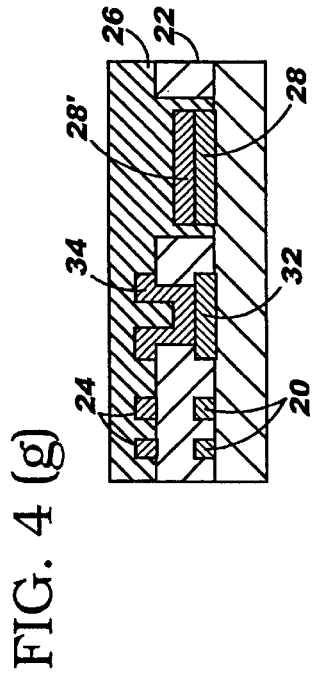
Figure 4:
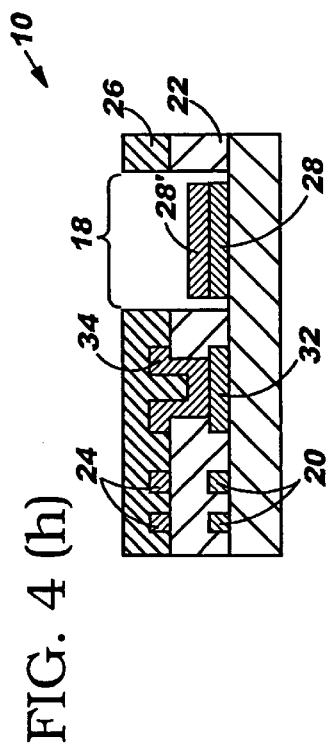
Figure 4:
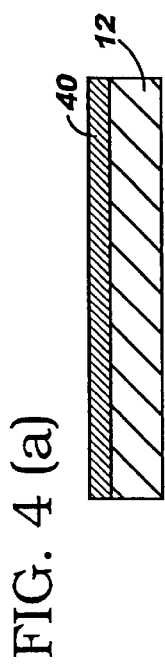
Figure 4:
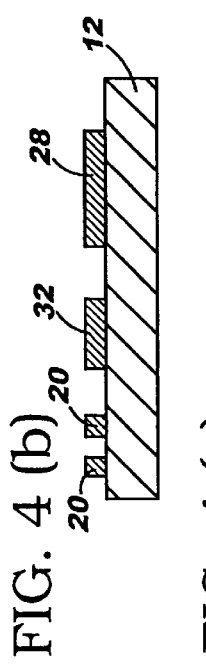
Figure 4:
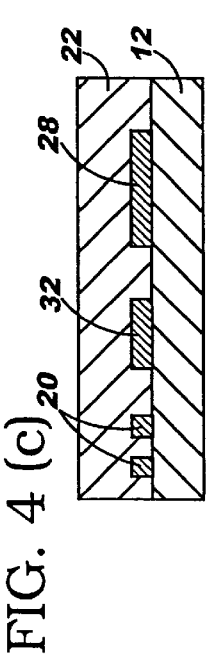
Figure 4:
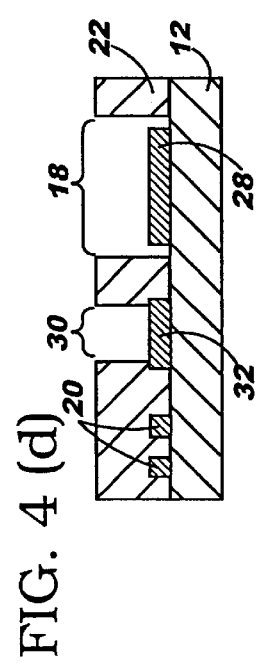
Figure 4:
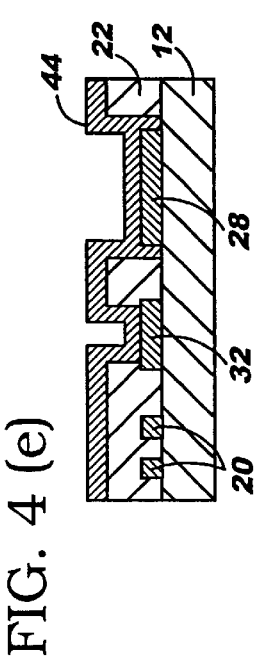

FIG. 1 is an enlarged partial cross-sectional view in elevation of a solder ball mounted on a surface of a substrate of a BGA module embodying the present invention. A BGA module 10 has at least an n-layer (n≧2) electrical structure on a solder ball-mounting surface and a cavity 18 for mounting a solder ball. BGA module 10 includes an (n−1)-layer electrical structure 14 and an n-layer electrical structure 16 positioned on a substrate 12. The n-layer is the outermost layer of the electrical structures. The (n−1)-layer electrical structure 14 comprises circuitry 20 and an insulation layer 22. The n-layer electrical structure 16 comprises circuitry 24 and a solder resist layer 26. The cavity 18 has a bottom wall defined by the same surface as the one on which circuitry 20 resides, and an opening with a side wall in both solder resist layer 26 of n-layer 16 and insulation layer 22 of (n−1)-layer electrical structure 14. A conductor 28 is positioned on the bottom wall. Another conductor 28' is positioned on conductor 28. Conductors 28 and 28' electrically connect a solder ball 29 (shown in phantom) to be mounted on conductor 28' with an electrical structure (not shown) inside substrate 12 of BGA module 10. A conductive photo via 30 electrically connects circuitry 20 in electrical structure 14 with circuitry 24 in n-layer electrical structure 16 through a conductor 32 positioned at the bottom of the conductive photo via and a conductor 34 on the inside wall of the via. This structure enables solder ball 29 to be held by cavity 18 in solder resist layer 26 and insulation layer 22 during mounting of the solder ball and keeps the solder ball from becoming dislodged during subsequent vibrations and heat changes which may occur in a subsequent reflow process.

FIGS. 4(a) to 4(f) shows an example of a manufacturing process for making BGA module 10 of FIG. 1. Specifically FIGS. 4(a) to 4(f) illustrate a process for forming (n−1)-layer electrical structure 14 and n-layer electrical structure 16 on substrate 12. In FIG. 4(a) copper layer 40 is positioned, preferably by a laminating process, on the surface of substrate 12. The circuitry 20, conductor 28, and conductor 32 are formed in copper layer 40 (FIG. 4(b)). A photosensitive resin is applied to, or a photosensitive film is laminated on, substrate 12 (FIG. 4(c)) to form insulation layer 22. Subsequently, the photosensitive resin or the photosensitive film is exposed to light through a photomask (not shown), developed, and hardened to form the photo-via 30 (FIG. 4(d)). At the same time, cavity 18 for mounting a solder ball is formed.

After a surface roughening process is performed on insulation layer 22, a copper layer 44 is formed, preferably by electroless plating and electroplating (FIG. 4(e)) and circuitry 24 included in the n-layer electrical structure 16 is formed (FIG. 4(f)). The circuitry 24 can be formed, for example, by panel copper plating and subtractive etching or additive copper plating. During this step, conductor 28' is additionally formed on the upper part of the conductor 28 at the bottom of cavity 18. In addition, conductor 34 is formed on the inside wall surface of photo-via 30.

Subsequently, solder resist layer 26 is formed (FIG. 4(g)). The solder resist layer 26 may be formed by applying a photosensitive resin to, or laminating a photosensitive film on, insulation layer 22. At this time, cavity 18 for mounting a solder ball is re-formed (FIG. 4(h)). The cavity 18 is extended by exposing the photosensitive resin or the photosensitive film to light followed by developing. Cavity 18 can also be formed in non-photosensitive solder resist by laser or plasma processing. The solder resist layer 26 plays an important role. It prevents shorts caused by a solder bridging between adjacent the solder balls, protects the surface of the substrate, and prevents insulation deterioration, and the like.

Cavity 18 has a height comprising the thickness of the insulation layer 22 in (n−1)-layer electrical structure 14 plus solder resist layer 26 in n-layer electrical structure 16. The preferred height is adjustable according to the diameter of the solder ball to be used and the electrical structure of the BGA.

FIG. 2 shows another embodiment of a BGA module 50 of the present invention in which a conductor 52 is positioned on the side wall and on conductor 28 on entire bottom wall of cavity 18. FIGS. 5(a') to 5(h') show some portions of a manufacturing process to make BGA module 50. The steps shown in FIGS. 5(a') to 5(e') are similar to those shown in FIGS. 4(a) to 4(e), so that their explanation is omitted. In BGA module 50, conductor 52 remains on the side walls and on conductor 28 on entire bottom wall of the cavity 18 during the formation process of circuitry 24 in n-layer electrical structure 16 (FIG. 5(f')). Since the steps in FIGS. 5(g') and 5(h'), illustrating the process to re-form cavity 18 after forming solder resist layer 26, are similar to FIGS. 4(g) and 4(h), their explanation is omitted.

Yet another embodiment of a BGA module of the present invention, is shown in FIG. 3. BGA module 60 includes a structure in which a portion of insulation layer 22 is positioned on and overlaps an end portion of conductive pad 28. FIGS. 6(a") to 6(d") show some portions of a manufacturing process to make BGA module 60. The steps illustrated in FIGS. 6(a") to 6(d") are similar to the steps illustrated in FIGS. 5(a') to 5(d'). In these steps, (n−1)-layer electrical structure 14 formed on substrate 12 is formed with photo-via 30 and cavity 18 formed in insulation layer 22. The insulation layer 22 is formed so that it overlaps the end portion of conductor 28. Subsequently, circuitry 24 and conductor 34 are formed by a semi-additive plating (FIG. 6(e")) and no conductive material is formed on conductor 28 in cavity 18.

Subsequently, solder resist layer 26 is laminated (FIG. 6(f")) to the structure of FIG. 6(e') and cavity 18 is extended into and through solder resist layer 26 (FIG. 6(g")). The technique is similar to that shown in FIGS. 4(g) and 4(h). The end portion of conductor 28, is coated with the end portion of insulation layer 22. End portion of solder resist layer 26 is positioned over the end portion of insulation layer 22 to form a side wall of cavity 18.

Figure 7:
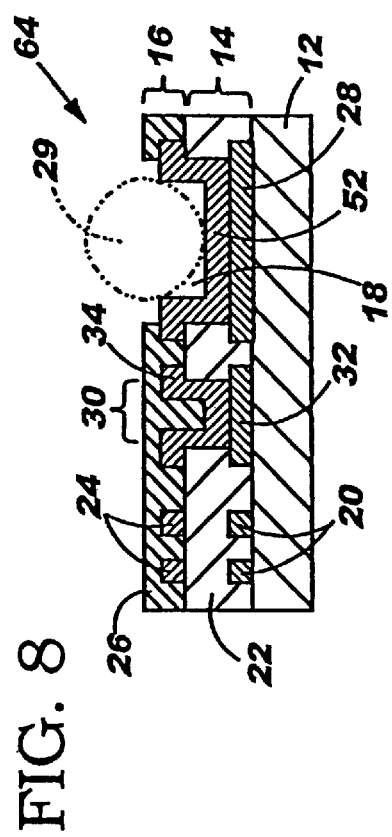
FIG. 7 is an enlarged partial cross-sectional view in elevation of still yet another embodiment of the BGA module according to the present invention.
Figure 8:
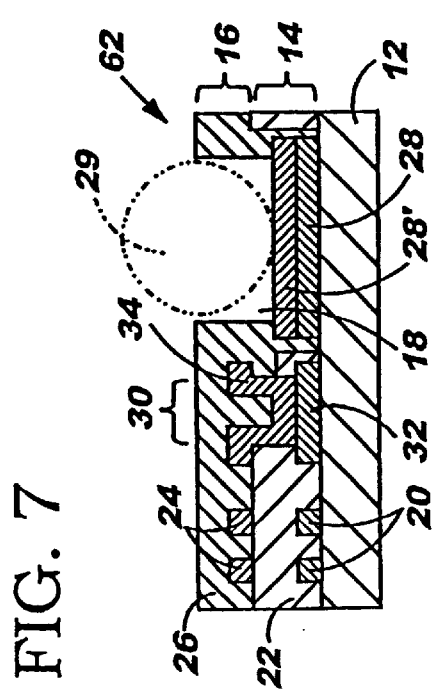
FIG. 8 is an enlarged partial cross-sectional view in elevation of another embodiment of the BGA module according to the present invention.
Figure 9:
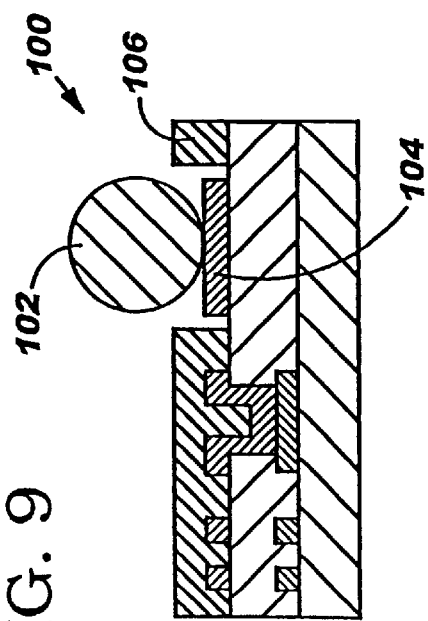
FIG. 9 is an enlarged partial cross-sectional view in elevation of a conventional BGA module.

Similar to the embodiment of BGA module 10, FIG. 7 shows a BGA module 62. In this embodiment, cavity 18 is formed in solder resist layer 26 and in insulation layer 22 such that the solder resist layer may partially overlap the end portion of conductor 28' in the cavity. FIG. 8 shows a BGA module 64 similar to the embodiment of BGA module 20 wherein solder resist layer 26 partially overlaps an end portion of conductor 52 on the side wall surface of cavity 18.

The conductor 28 arranged at the bottom of cavity 18 and circuitry in substrate 12 (not shown) may be electrically interconnected.

Once a BGA module of the present invention is manufactured, a solder ball is attached to the conductor positioned at the bottom of cavity 18 provided on the substrate.

One example of bonding a solder ball to a BGA module of the present invention will now be described. The present invention is not limited to this process. At least one semiconductor chip can be mounted on one of the surfaces of a BGA module and is electrically interconnected to the circuitry of the substrate. Next, a solder ball is bonded to a conductor positioned on the bottom wall of the cavity. The solder ball can be bonded to the conductor by the process of applying flux onto the conductor, arranging the solder ball on the fluxed conductor, reflowing the solder, and cleaning the flux. The semiconductor chip is thereby electrically connected to the electrical structure formed in the BGA module. This BGA module can be further attached to a prepared circuit card.

As described above, the present invention has been described in detail, but the present invention is not limited to the described embodiments. For example, in the BGA module of the present invention, the thickness of the solder resist can be varied. In addition, the cavity may be formed over a two-layer electrical structure.

What has been shown and described are at present considered the preferred embodiments of this invention. It will be obvious to those skilled in the art that various changes and modifications can be made therein without departing from the scope of the invention as defined by the appended claims.

What is claimed is:

1. A ball grid array module having a surface for mounting a semiconductor chip and a solder ball comprising:
    a substrate having an upper surface;
    a first insulation layer including a first layer of circuitry therein positioned on said upper surface of said substrate;
    a second insulation layer including a second layer of circuitry therein positioned on said first insulation layer; and
    at least one internal side wall defining a cavity in said first and second insulation layers, said upper surface of said substrate farther defining a bottom wall of said cavity, said bottom wail having a conductive lava connected to at least one of said layers of first and second circuitry adapted for having said solder ball positioned thereon.

2. The ball grid array module according to claim 1, wherein said second insulation layer comprises a solder resist.

3. The ball grid array module according to claim 1, wherein said cavity prevents dislodgment of said solder ball during heating of said ball grid array module.

4. The ball grid array module according to claim 1, wherein a portion of said first layer of circuitry in said first insulation layer is positioned between said conductive layer and said bottom wall of said cavity.

5. The ball grid array module according to claim 4, wherein said conductive layer includes an end portion.

6. The ball grid array module according to claim 5 wherein at least one of said first or said second insulation layers overlaps said end portion of said conductive layer.

7. A method of manufacturing a ball grid ray module having a surface for mounting a solder ball comprising the steps of:
    providing a substrate having an upper surface;
    positioning a first insulation layer including a first layer of circuitry therein on said upper surface of said substrate;
    positioning a second insulation layer including a second layer of circuitry therein on said first insulation layer; and
    forming at least one internal side wall defining a cavity in said first and second insulation layers, said upper surface of said substrate further defining a bottom wall of said cavity, adapted for having said solder ball positioned thereon, and positioning a layer of conductive material having an end portion on at least a portion of said bottom wall of said cavity.

8. The method according to claim 7, wherein positioning said first insulation layer comprises laminating a photosensitive resin or photosensitive film on said upper surface of said substrate.

9. The method according to claim 7, wherein positioning said second insulation layer comprises laminating a solder resist on said first insulation layer.

10. A ball grid array module having a surface for mounting a semiconductor chip and a solder ball comprising:
    a substrate having an upper surface;
    a first insulation layer including a first layer of circuitry therein positioned on said upper surface of said substrate;
    a second insulation layer including a second layer of circuitry therein positioned on said first insulation layer; and
    at least one internal side wall defining a cavity in said first and second insulation layers, said upper surface of said substrate further defining a bottom wall of said cavity, said bottom wall having a conductive layer connected to at least one of said layers of first and second circuitry adapted for having said solder ball positioned thereon, and wherein said conductive layer is also positioned on said at least one internal side wall of said cavity in said first and second insulation layers.

11. The ball grid array module according to claim 10, wherein said conductive layer on said at least one internal side wall and on said portion of said bottom wall of said cavity is electrically connected to at least one of said first and second layers of circuitry.

12. The ball grid array module according to claim 11, wherein a portion of said first layer of circuitry in said first insulation layer is positioned between said conductive layer and said bottom wall of said cavity.

13. The ball grid array module according to claim 12, wherein said conductive layer includes an end portion.

14. The ball grid array module according to claim 13, wherein at least one of said first or said second insulation layers overlaps said end portion of said conductive layer.

15. The ball grid ray module according to claim 14, further including at least one conductive via in said first insulation layer.

16. A method of manufacturing a ball grid array module having a surface for mounting a solder ball comprising the steps of:
    providing a substrate having an upper surface;
    positioning a first insulation layer including a first layer of circuitry therein on said upper surface of said substrate;
    positioning a second insulation layer including a second layer of circuitry therein on said first insulation layer; and
    forming at least one internal side wall defining a cavity in said first and second insulation layers, said upper surface of said substrate further defining a bottom wall of said cavity adapted for having said solder ball positioned thereon, and positioning a layer of conductive material having an end portion on at least a portion of said bottom wall of said cavity, wherein positioning said layer of conductive material on said at least said portion of said bottom wall of said cavity further includes the step of positioning said conductive material on said at least one internal side wall in said first and second insulation layers.

17. The method according to claim 16, further including the step of positioning a portion of said first layer of circuitry in said first insulation layer between said conductive layer and said bottom wall of said cavity.

18. The method according to claim 17, wherein positioning of said second insulation layer comprises overlapping said end portion of said layer of conductive material with at least one of said first or said second insulation layers.

19. The method according to claim 18, further including the step of forming a conductive via in said first insulation layer.

* * * * *